United States Patent [19]

Thorpe

[11] Patent Number: 4,496,918

[45] Date of Patent: Jan. 29, 1985

[54] RADIO FREQUENCY ALTERNATE-PATH PHASE SWITCH

[75] Inventor: William Thorpe, Felixstowe, England

[73] Assignee: British Telecommunications, London, England

[21] Appl. No.: 461,529

[22] Filed: Jan. 27, 1983

[30] Foreign Application Priority Data

Feb. 2, 1982 [GB] United Kingdom ................ 8202999

[51] Int. Cl.³ ........................ H01P 1/185; H01P 3/08; H03C 3/00
[52] U.S. Cl. ................................. 333/164; 332/29 R; 333/161; 333/246
[58] Field of Search ............... 333/156, 157, 160, 161, 333/164, 245, 246; 332/16 R, 23 R, 29 R

[56] References Cited

U.S. PATENT DOCUMENTS

| 3,568,105 | 3/1971 | Felsenheld ...................... 333/164 X |
| 4,001,734 | 1/1977 | Burns ................................. 333/164 |
| 4,160,220 | 7/1979 | Stachejko ...................... 333/246 X |

Primary Examiner—Marvin L. Nussbaum
Attorney, Agent, or Firm—Cushman, Darby & Cushman

[57] ABSTRACT

An alternate-path phase switch has a primary conductive region and control regions which provide alternate paths in gaps formed with the primary region. Switching means, e.g. PIN-diodes, control the potentials on the control regions and select the path followed by microwave radiation. Each path results in a different phase in the output so the device acts as a phase modulator.

9 Claims, 5 Drawing Figures

RADIO FREQUENCY ALTERNATE-PATH PHASE SWITCH

DESCRIPTION

The invention relates to a microwave alternate path phase switch. The processing of radio micro-waves, eg. those having frequencies of 1 to 250 GHz and especially 20 to 100 GHz, is often carried out by modifying the waves in waveguides. In particular phase modulation is achieved by switching an (unmodulated) carrier frequency between alternate paths wherein the change of path is accompanied by a change of phase. It is difficult to achieve switching at high speeds, e.g. above 10 Mbits/sec, and it is an object of the invention to achieve this.

Known devices for providing such phase modulation include an input and an output which are connected by a pair of waveguide paths. The device includes switching means associated with each waveguide path, the switching means being operable to provide alternative paths between the input and the output. The phase of the output signal depends upon which path is followed and thus phase modulation can be applied to a signal by appropriately operating the switching means. Typically the switching means include diodes. The frequency at which the device can be switched is limited by the frequency at which the diodes can be switched. The present invention provides a device having a structure which permits switching at higher frequencies than has been possible previously with devices of this type.

According to this invention a microwave alternate-path phase switch, which provides alternate paths from an input to an output and a selector for selecting which path a microwave will follow, the paths being such that the phase of the output signal depends on the path followed, is characterised in that the selector comprises discrete conductive regions connected for the transmission frequency but disconnected at the modulation frequency wherein each of said discrete regions is connected to a primary conductive region via separate and independent switching means and a gap between each of discrete regions and the primary conductive regions constitutes one of said alternate paths. Most conveniently the various conductive regions take the form of metal layers supported on a dielectric substrate.

A preferred embodiment of the invention takes the form of a dielectric substrate, eg. a plastic film, which on one side supports a primary conductive region having an aperture and an input slot which provides an input path by slotline transfer and on the other side supports a secondary conductive region which co-operates with the primary conductive region to provide an output path by microstrip transfer, characterised in that, in the aperture, the substrate supports two discrete conductive regions connected at the transmission frequency but disconnected at the modulation frequency wherein each of said discrete conductive region is connected to the primary conductive region via separate and independent switching means whereby gaps between the peripheries of the discrete regions and the peripheries of the primary region provide alternate paths by slotline transfer from the input path to the output path and activation of the independent switching means provides phase modulation by selecting one of the two alternative paths.

Each switching means may be a PIN-diode.

The invention will now be described by way of example only with particular reference to the accompanying drawings in which.

Figure 1:
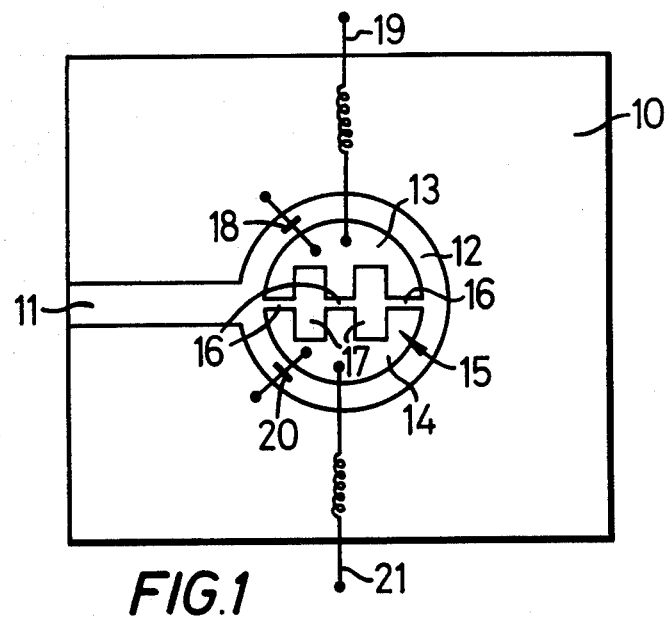
FIG. 1 is a schematic view of a switch showing conductive regions on one side of a dielectric substrate.
Figure 2:
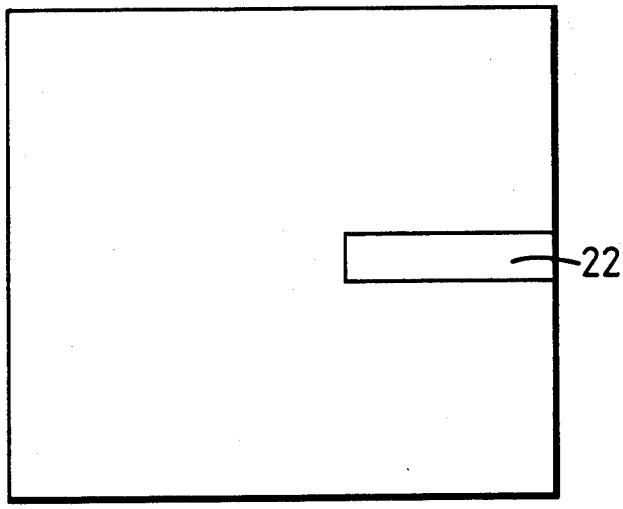
FIG. 2 shows a conductive region on the other side of the substrate.
Figure 3:
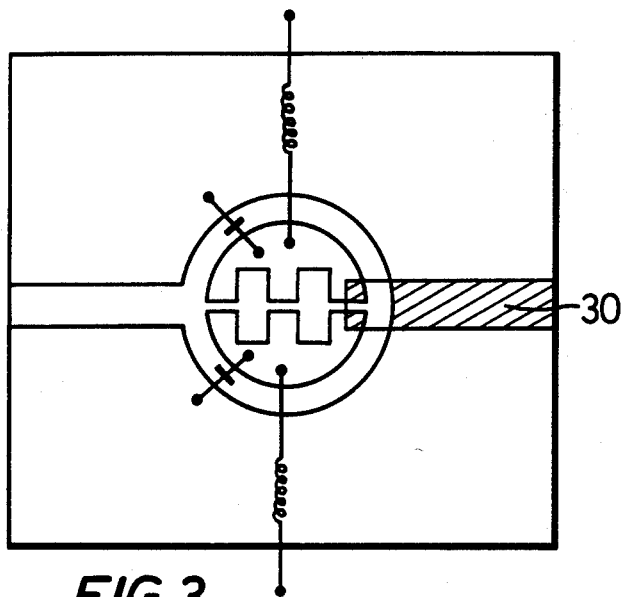
FIG. 3 is a composite of FIGS. 1 and 2 showing the relative position on both sides of the substrate.

The radio frequency alternate-path phase switch shown in FIGS. 1, 2 and 3 is formed of regions of copper on the surfaces of a plastic film which forms a dielectric substrate. In accordance with conventional practice the switch was formed from plastic film having complete layers of copper on both surfaces. The patterns shown in FIGS. 1 and 2 were then produced by etching away the unwanted copper.

FIG. 1 shows the pattern on one side of the film. Most of the surface is covered by a primary conductive region 10; the exceptions being an input slot 11 and an aperture 12. The aperture 12 contains two discrete conductive regions 13 and 14 which are separated by a slot-line structure 15 which comprises three narrow lines 16 linked by two wide slots 17. Discrete region 13 is connected to the primary region 10 via a PIN-diode 18 and the bias to actuate the diode 18 is obtained via the lead 19 connected to discrete region 13. Similarly discrete region 14 is connected to the primary region 10 via PIN-diode 20 biased via lead 21. As can be seen in FIG. 2 on the reverse side of the substrate the majority of the copper is etched away to leave a rectangular secondary conductive region 22, which is located opposite the input slot 11. FIG. 3 shows the supposition of FIGS. 1 and 2, the shaded region 30 indicates where the substrate is sandwiched between two layers of copper.

Figure 4:
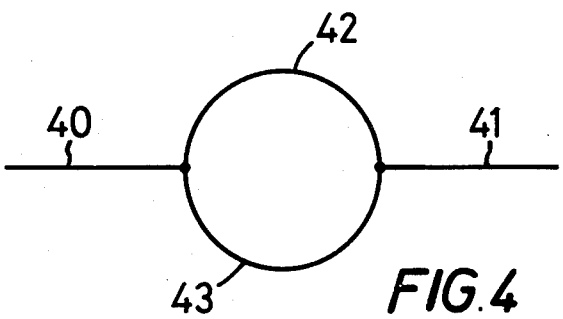
FIG. 4 is a diagram showing the paths provided by the arrangement shown in FIGS. 1, 2 and 3.

The regions shown in FIGS. 1, 2 and 3 provide the network of paths shown diagramatically in FIG. 4. The network comprises an input path 40, an output path 41 with alternative paths 42 and 43 linking the input path 40 to the output path 41. The input path 40 is constituted by slotline transmission in the slot 11 and the output path 41 is constituted by microstrip transmission in the sandwich region 30 (FIG. 3). The alternate paths 42 and 43 are constituted by slotline transmission in the gap between the periphery of the regions 13 and 14 and the periphery of the aperture 12. More specifically, the path 42 corresponds to the gap between regions 13 and 10 and the path 43 to the gap between regions 14 and 10.

The operation of the device will now be described. External circuitry (not shown in any drawing) biases one of the diodes 18 or 20 via its lead 19 or 20. When a diode is biased it provides a short circuit between its discrete region and primary region 10 and this prevents transmission of energy through the peripheral slot between the two. Thus when region 13 is biased via lead 19, diode 18 is conductive and the microwave energy passes through path 43. When the path switches (in response to switching the diodes 18 and 20) there is a change of phase of 180° at the output path 41 so the device acts as a phase-modulation switch.

By way of emphasis it is pointed out that diodes 18 and 20 function independently. This important requirement is achieved through the use of the slotline structure 15. This structure physically separates the region 13 from the region 14 so that d.c. bias on one does not transfer to the other. This arrangement permits a higher switching speed than has been possible with known devices. However it is important that the two regions 13 and 14 should have the effect of a single region upon the carrier wave in the inlet slot 11 i.e. the slotline structure should appear as a short circuit at the transmission frequency. As shown in FIG. 1 the slotline structure 15 is formed of three narrow segments 16 and two wide segments 17 and each of these five segments has a nominal length of one quarter of a wave length at the transmission frequency, i.e. the total (nominal) length of the slotline structure is 5/4 wave lengths. It has been found that a slotline structure of this form is operative to separate the two regions 13 and 14 at the modulation frequency but not at the transmission frequency. (In an ideal structure the dimension would be exactly one quarter of a wave length. There will be departures from the ideal due to capacitive effects and changes of size).

The switch described is capable of phase-modulating microwave carrier frequencies, e.g. 20–100 GHz, at high power, e.g. up to 150 mW, and high rates of modulation, e.g. 300 Mbits/sec.

Figure 5:
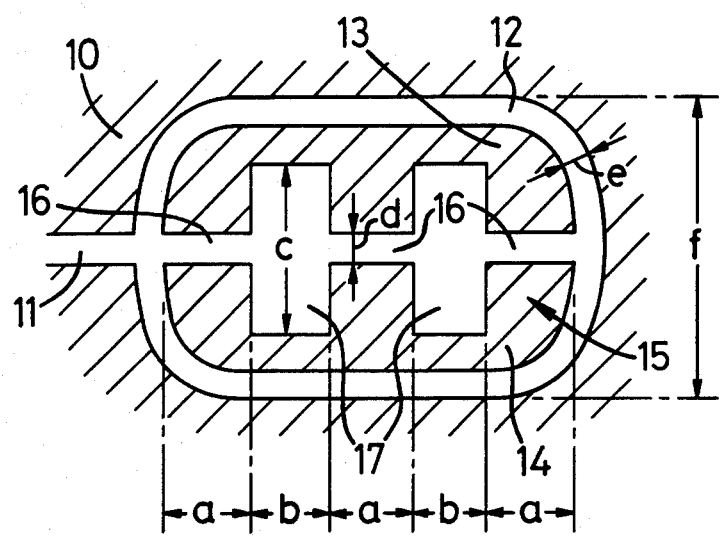
FIG. 5 is a schematic view illustrating a particular example of the present invention.

A particular example of a device for operation in the 27.5 to 29.5 GHz frequency band is shown in FIG. 5. The device operates as described above and has a substrate of RT Duroid 5880. The dimensions are as follows.

$a = 2.48$ m.m.

$b = 1.37$ m.m.

$c = 2.84$ m.m.

$d = 0.14$ m.m.

$e = 0.17$ m.m.

$f = 5.32$ m.m.

I claim:

1. A microwave alternate-path phase switch which provides alternate paths from an input to an output and a selector for selecting which path an input carrier microwave signal will follow from said input to said output, the paths being such that the phase of the output carrier microwave signal depends on the path followed characterized in that the selector comprises:
   a primary conducting region;
   discrete conductive regions juxtaposed so as to present a low r.f. impedance therebetween for the transmission thereacross of said carrier microwave signal but presenting a high impedance to a lower modulation frequency signal used to select which of said alternate paths is to be used;
   each of said discrete conductive regions being connected to said primary conductive region via separate and independent switching means for selecting which of said alternate paths is to be used; and
   a gap between each of the discrete regions and the primary conductive region constituting respective ones of said alternate paths.

2. A switch according to claim 1 further comprising:
   a dielectric substrate which on one side supports said primary conductive region having an aperture and an input slot which provides an input path by slotline transfer and which, on the other side, supports a secondary conductive region which co-operates with the primary conductive region to provide said output by microstrip transfer,
   said primary conductive region having said aperture in which the substrate supports two said discrete conductive regions whereby gaps between peripheries of said discrete regions and peripheries of the aperture in said primary region provide said alternate paths by slotline transmission and said independent switching means provides phase modulation of said input carrier microwave signal by selecting one of said two alternative paths.

3. A switch according to claim 2 in which the substrate is a plastic film.

4. A switch as claimed in claim 2 wherein said discrete conductive regions are separated by a slot the shape and dimensions of which are selected such that there is a substantially short circuit r.f. impedance presented between the regions at the carrier microwave frequency but not at the lower modulation frequency at which said switching means is to be operated.

5. A switch according to claim 1 in which each switching means is a PIN-diode.

6. A microwave alternate-path phase switch comprising:
   a dielectric substrate;
   a primary conductive area disposed on said substrate and having an aperture therein;
   two discrete conductive regions disposed on said substrate and within said aperture with gaps between the discrete conducting regions and said aperture defining respective first and a second differently phased microwave r.f. transmission paths leading from a microwave r.f. input to a microwave r.f. output; and p1 first and second switch means for selectively connecting alternate ones of said discrete conductive regions to said primary conductive area when electrically biased by a modulation signal thus selectively passing input microwave r.f. signals along a respective one of said transmission paths;
   said two discrete conductive regions also being separated by a gap which presents substantially a short circuit impedance thereacross at the frequency of said input microwave r.f. signals but which presents a substantially higher impedance thereacross at the lower frequency of said biasing modulation signal whereby independent control of each of said switch means is maintained.

7. A microwave alternate-path phase switch as in claim 6 further comprising:
   an input slot in said primary conductive area leading from said microwave r.f. input for transferring input microwave signals to said input by slotline transfer; and
   a microstrip transmission line conductor disposed on said dielectric opposite said primary conductive area and leading from said microwave r.f. output for transferring output phase-modulated microwave signals by microstrip transmission line transfer.

8. A microwave alternate-path phase switch as in claim 7 wherein said substrate comprises a plastic film.

9. A microwave alternate-path phase switch as in claim 7 wherein each said switching means comprises a PIN diode.

* * * * *